United States Patent
Lai

(10) Patent No.: US 8,852,973 B2
(45) Date of Patent: *Oct. 7, 2014

(54) METHOD FOR MANUFACTURING LIGHT EMITTING DIODE MODULE

(71) Applicant: Hon Hai Precision Industry Co., Ltd., New Taipei (TW)

(72) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/928,168

(22) Filed: Jun. 26, 2013

(65) Prior Publication Data

US 2014/0179039 A1   Jun. 26, 2014

(30) Foreign Application Priority Data

Dec. 24, 2012  (TW) .............................. 101149449 A

(51) Int. Cl.
  *G06F 15/00* (2006.01)
  *H01L 33/58* (2010.01)

(52) U.S. Cl.
  CPC ...................................... *H01L 33/58* (2013.01)

USPC ................... 438/27; 438/15; 438/25; 438/26; 438/51; 438/55

(58) Field of Classification Search
  USPC ............... 438/27, 15, 26, 51, 55, 64; 257/676
  See application file for complete search history.

(56) References Cited

U.S. PATENT DOCUMENTS 7,643,061 B2 * 1/2010 Yamagishi ............... 348/207.99
2013/0119411 A1 * 5/2013 Lai ................................. 257/88

* cited by examiner

*Primary Examiner* — Zandra Smith
*Assistant Examiner* — Damian A Hillman
(74) *Attorney, Agent, or Firm* — Novak Druce Connolly Bove + Quigg LLP

(57) ABSTRACT

A method for manufacturing an LED module includes following steps: providing a SMT (Surface Mount Technology) apparatus having a CCD (Charge-Coupled Device) image sensor and a nozzle, and providing a PCB and fixing the PCB in the SMT apparatus; providing a plurality of LEDs and mounting the LEDs on the PCB by the SMT apparatus; providing a plurality of lenses each having a plurality of patterned portions formed on an outer face of the lens, and the CCD image sensor imaging the lens and identifying the patterned portions, and then the SMT apparatus obtaining a location of the lens relative to the LED; positioning the lens on the PCB to cover the LED by the SMT apparatus; and fixing the lens on the PCB.

20 Claims, 5 Drawing Sheets

METHOD FOR MANUFACTURING LIGHT EMITTING DIODE MODULE

BACKGROUND

1. Technical Field

The disclosure generally relates to a method for manufacturing a light emitting diode (LED) module.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

A conventional backlight module includes a flat back cover and a plurality of LED modules mounted on the back cover in array. Each of the LED modules should have an illumination angle as large as possible. To achieve this objective, an optical lens is usually required to be placed above the LED. Generally, in a conventional method for manufacturing the LED module, the LEDs are firstly fixed on a PCB by SMT (Surface Mount Technology) apparatus, and then the lenses are correspondingly positioned above the LEDs, finally the lenses are fixed on the PCB.

However, it is hard to position the lenses corresponding to the LEDs accurately, it may cause unsuitable light emitting effect of the LED module.

What is needed, therefore, is a method for manufacturing an LED module to overcome the above described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Embodiments of a method for manufacturing a light emitting diode (LED) module will now be described in detail below and with reference to the drawings.

Figure 1:
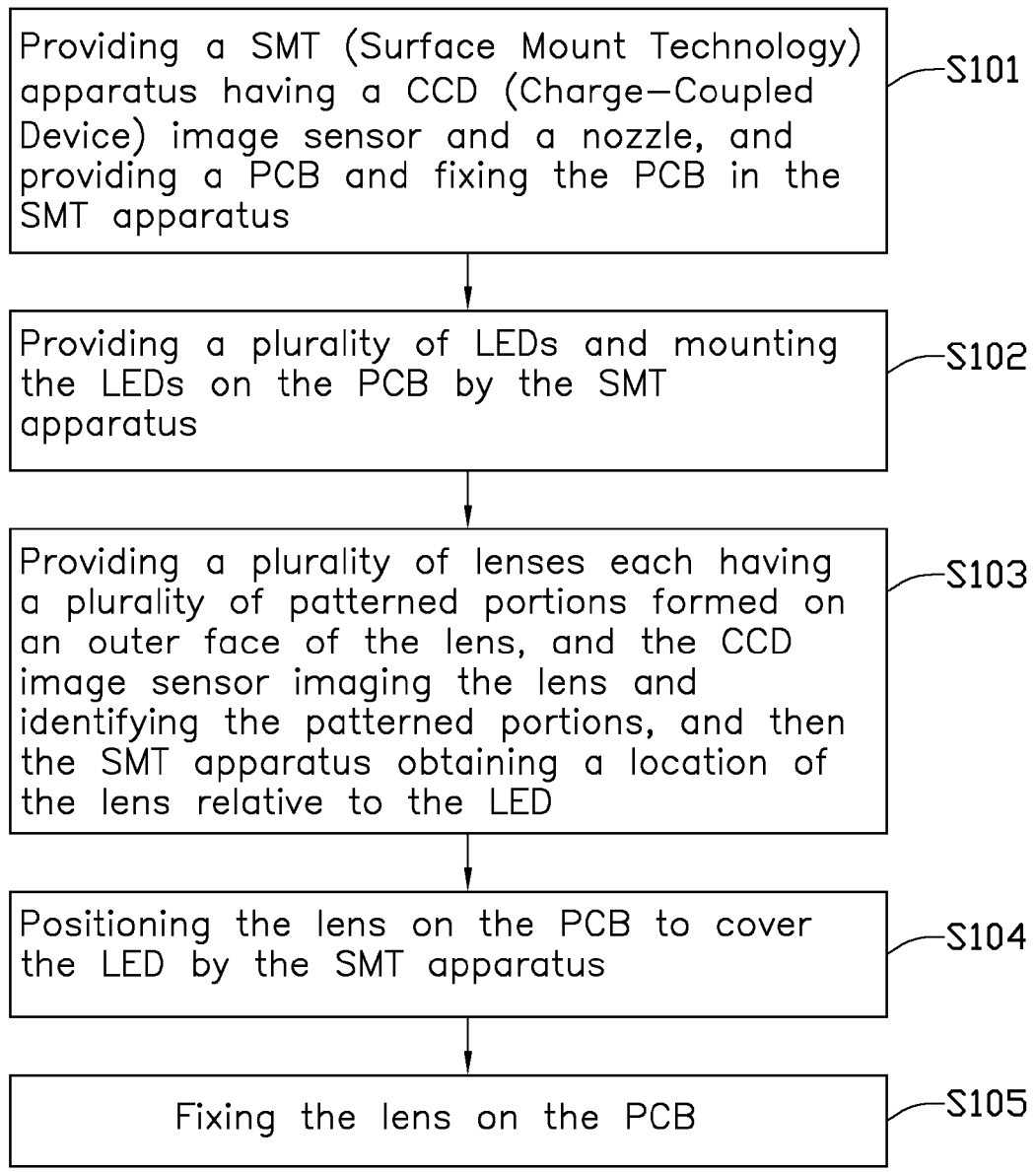
FIG. 1 is a flow chart of a method for manufacturing an LED module in accordance with an embodiment of the present disclosure.
Figure 2:
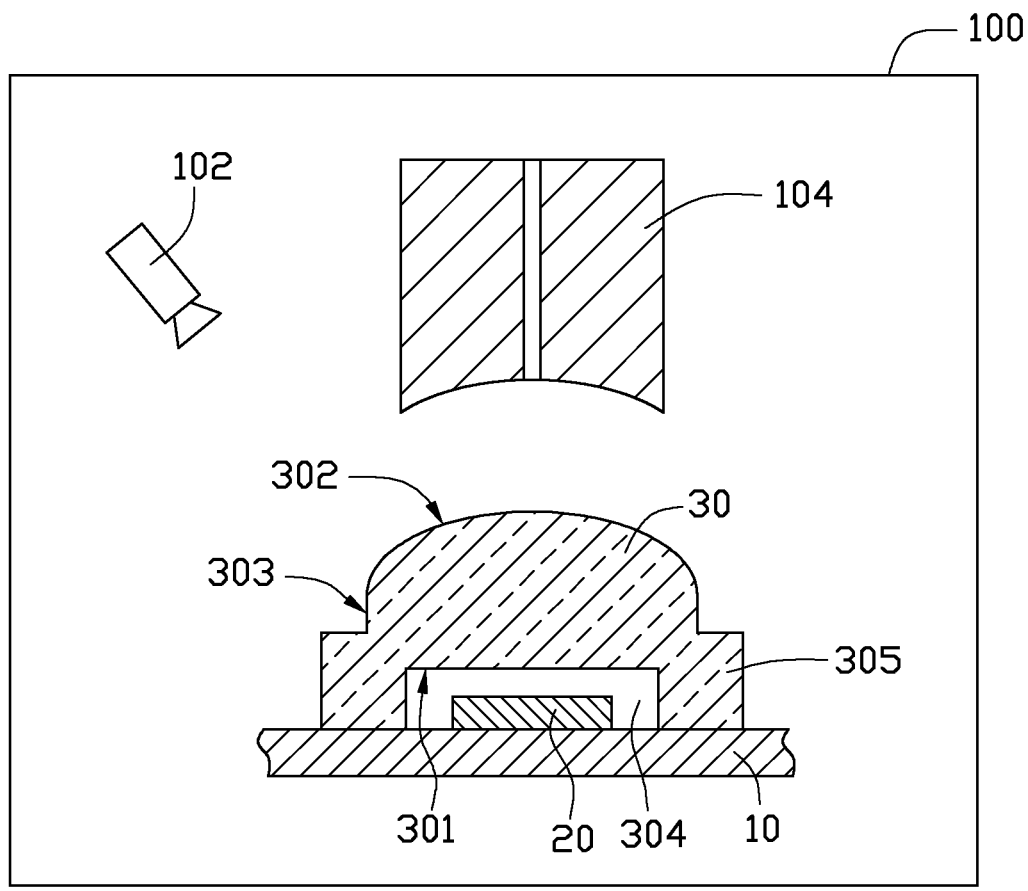
FIG. 2 is a schematic view of the method of FIG. 1.

Referring to FIGS. 1-2, a method for manufacturing an LED module in accordance with a first embodiment is provided. The method for manufacturing the LED module includes following steps.

Step S101, a SMT (Surface Mount Technology) apparatus 100 is provided, and an elongated PCB 10 is positioned in the SMT apparatus 100. The SMT apparatus 100 has a CCD (Charge-Coupled Device) image sensor 102 and a nozzle 104.

Step S102, a plurality of LEDs 20 are provided. The LEDs 20 are mounted on the PCB 10 by the SMT apparatus 100.

Figure 3:
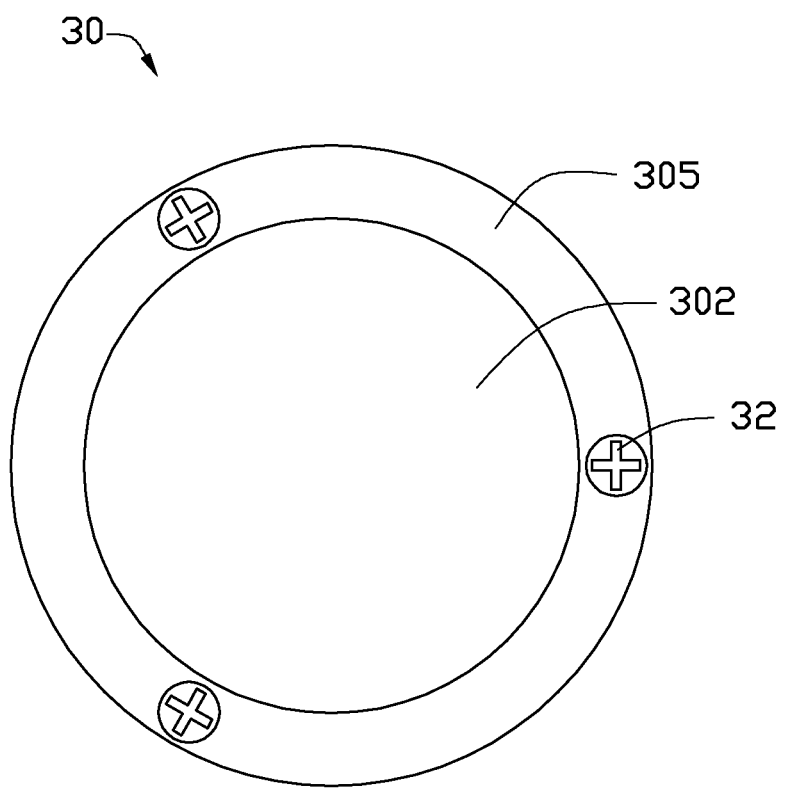
FIG. 3 is a top view of a lens of an LED module manufactured by the method of FIG. 1.

Step S103, a plurality of lenses 30 are provided. Referring also to FIG. 3, each lens 30 has a plurality of patterned portions 32 formed on an outer face of the lens 30. Each lens 30 is imaged by the CCD image sensor 102, the patterned portions 32 are identified by the CCD image sensor 102, and a location of the lens 30 relative to a corresponding LED 20 is obtained by the SMT apparatus 100.

Step S104, the lenses 30 are correspondingly positioned on the PCB 10 and cover the LEDs 20 by the SMT apparatus 100.

Step S105, the lenses 30 are fixed on the PCB 10.

In detail, a manner of positioning each lens 30 on the PCB 10 by the SMT apparatus 100 includes following steps. Firstly, the PCB 10 with the LEDs 20 mounted thereon is fixed in the SMT apparatus 100. Secondly, a corresponding lens 30 is carried by the nozzle 104 of the SMT apparatus 100. Thirdly, the lens 30 is imaged by the CCD image sensor 102, and the patterned portions 32 of the lens 30 are identified by the CCD image sensor 102. Fourthly, a location variation between the lens 30 and a corresponding LED 20 on the PCB 10 is calculated by the SMT apparatus 100. Finally, the lens 30 is positioned on the PCB 10 and covers the corresponding LED 20 by the nozzle 104 of the SMT apparatus 100, according to the location variation.

Each lens 30 is integrally made of transparent materials such as PC (polycarbonate) or PMMA (polymethyl methacrylate). A dimension of the lens 30 is about 3 mm.

Each lens 30 includes a light-incident face 301 facing the LED 20, a light-emitting face 302 opposite to the light-incident face 301, and a lateral face 303 interconnecting the light-incident face 301 and the light-emitting face 302. A center of a bottom portion of the lens 30 is recessed inwardly to form a receiving room 304 for accommodating the LED 20 therein. The light-emitting face 302 is convex and has a dome-like profile. The lens 30 further includes an annular flange 305 protruding outwardly form the lateral face 303 of the lens 30.

The patterned portions 32 of each lens 30 are formed on a top face of the annular flange 305. It can be understood that, the patterned portions 32 could be formed on the light-incident face 301, the light-emitting face 302 or the lateral face 303 of the lens 30. A dimension of the patterned portion 32 is about 0.1 mm. In this embodiment of the disclosure, there are three patterned portions 32 evenly spaced from each other.

Figure 4:
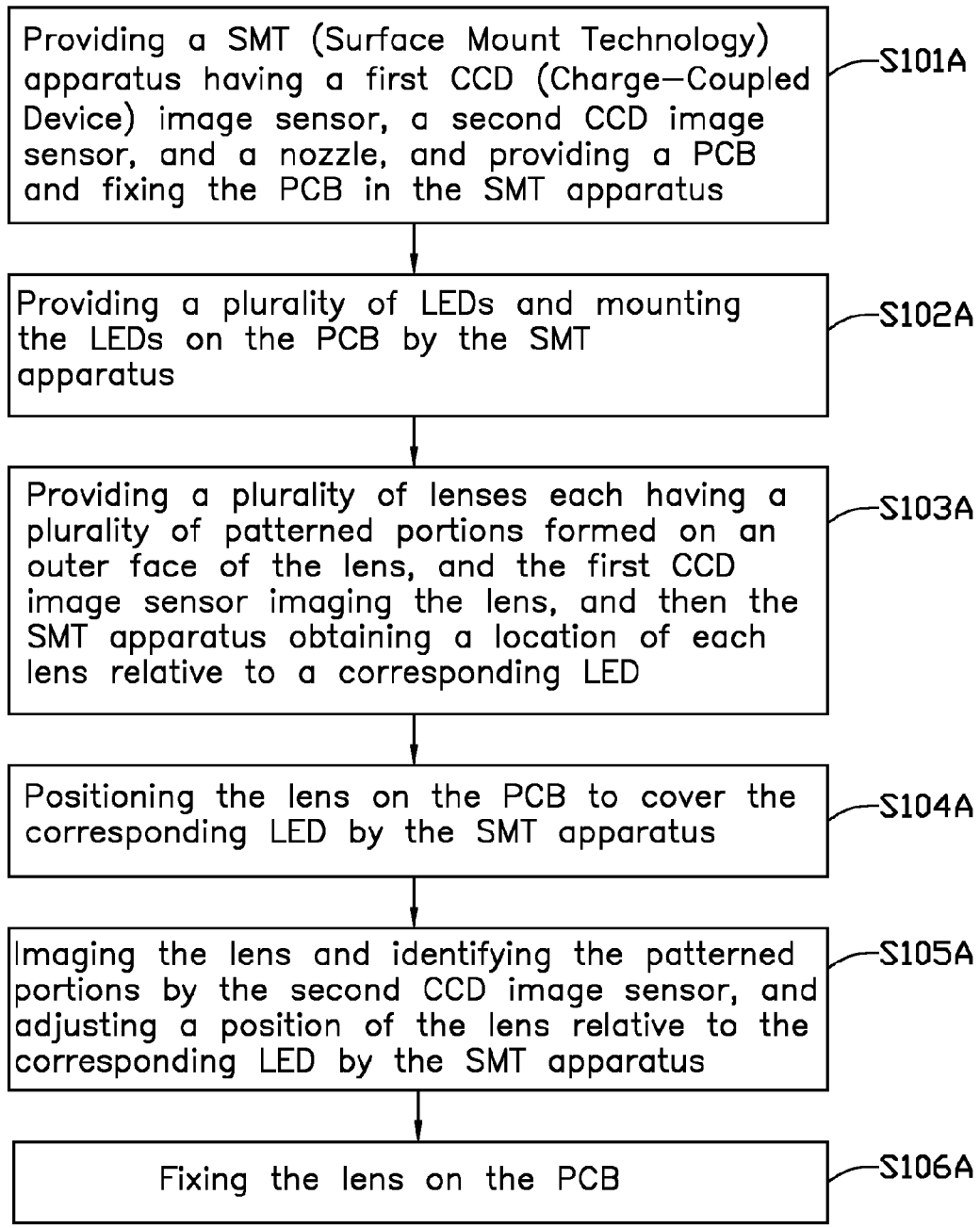
FIG. 4 is a flow chart of a method for manufacturing an LED module in accordance with a second embodiment of the present disclosure.
Figure 5:
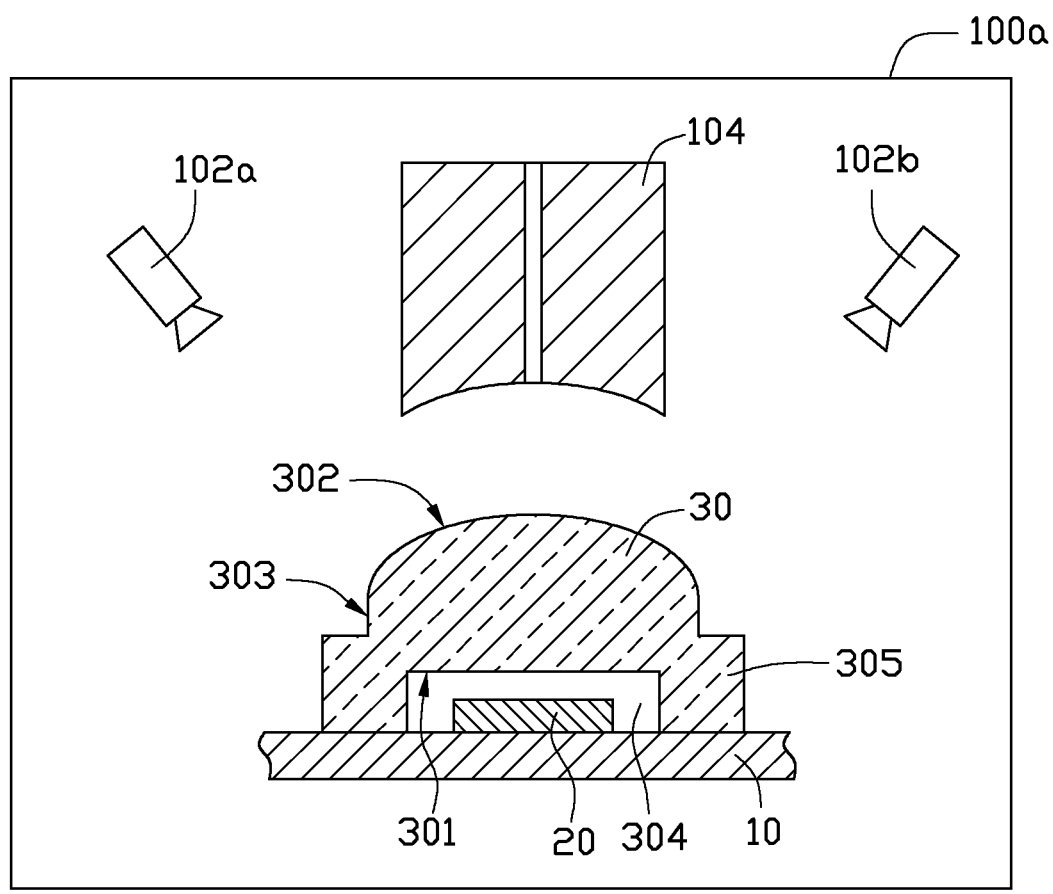
FIG. 5 is a schematic view of the method of FIG. 4.

Referring to FIGS. 4-5, a method for manufacturing an LED module in accordance with a second embodiment is provided.

Step S101A, a SMT (Surface Mount Technology) apparatus 100a is provided, and an elongated PCB 10 is positioned in the SMT apparatus 100a. The SMT apparatus 100a has a first CCD (Charge-Coupled Device) image sensor 102a, a second CCD image sensor 102b, and a nozzle 104. A resolution of the second CCD image sensor 102b is higher than that of the first image sensor 102a.

Step S102A, a plurality of LEDs 20 are provided. The LEDs 20 are mounted on the PCB 10 by the SMT apparatus 100a.

Step S103A, a plurality of lenses 30 are provided. Each lens 30 is imaged by the first CCD image sensor 102a, and a location of the lens 30 relative to a corresponding LED 20 is obtained by the SMT apparatus 100a.

Step S104A, the lenses 30 are correspondingly positioned on the PCB 10 and cover the LEDs 20 by the SMT apparatus 100a.

Step S105A, each lens 30 has a plurality of patterned portions 32 formed on an outer face of the lens 30, the lens 30 is imaged by the second CCD image sensor 102b, the patterned portions 32 are identified by the second CCD image sensor 102b, and a position of at least a corresponding lens 30 is adjusted by the SMT apparatus 100.

Step S106A, the lenses 30 are fixed on the PCB 10

In detail, a manner of positioning each lens 30 on the PCB 10 by the SMT apparatus 100a includes following steps. Firstly, the PCB 10 with the LEDs 20 mounted thereon is fixed in the SMT apparatus 100a. Secondly, a corresponding lens 30 is carried by the nozzle 104 of the SMT apparatus 100a. Thirdly, the lens 30 is imaged by the first CCD image sensor 102a, a profile of the lens 30 is identified by the first CCD image sensor 102a. Fourthly, a first location variation between the lens 30 and a corresponding LED 20 on the PCB 10 is calculated by the SMT apparatus 100a. Fifthly, the lens 30 is positioned on the PCB 10 and covers the corresponding LED 20 by the nozzle 104 of the SMT apparatus 100a, according to the first location variation. Sixthly, the lens 30 is imaged by the second CCD image sensor 102b, and the patterned portions 32 (as shown in FIG. 3) of the lens 30 are identified by the second CCD image sensor 102b. Seventhly, a second location variation between the lens 30 and the corresponding LED 20 is calculated by the SMT apparatus 100a. Finally, a position of the lens 30 covering the corresponding LED 20 is adjusted by the nozzle 104 of the SMT apparatus 100a, according to the second location variation.

Each lens 30 is integrally made of transparent materials such as PC (polycarbonate) or PMMA (polymethyl methacrylate). A dimension of the lens 30 is about 3 mm.

Each lens 30 includes a light-incident face 301 facing the LED 20, a light-emitting face 302 opposite to the light-incident face 301, and a lateral face 303 interconnecting the light-incident face 301 and the light-emitting face 302. A center of a bottom portion of the lens 30 is recessed inwardly to form a receiving room 304 for accommodating the LED 20 therein. The light-emitting face 302 is convex and has a dome-like profile. The lens 30 further includes an annular flange 305 protruding outwardly form the lateral face 303 of the lens 30.

Referring to FIG. 3 again, the lens 30 of the second embodiment is the same as that of the first embodiment, the patterned portions 32 of each lens 30 are formed on a top face of the annular flange 305. It can be understood that, the patterned portions 32 could be formed on the light-incident face 301, the light-emitting face 302 or the lateral face 303 of the lens 30. A dimension of the patterned portion 32 is about 0.1 mm. In this embodiment of the disclosure, there are three patterned portions 32 evenly spaced from each other.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a light emitting diode (LED) module, comprising following steps:
   providing a SMT (Surface Mount Technology) apparatus having a CCD (Charge-Coupled Device) image sensor and a nozzle, and providing a PCB and fixing the PCB in the SMT apparatus;
   providing a plurality of LEDs and mounting the LEDs on the PCB by the SMT apparatus;
   providing a plurality of lenses each having a plurality of patterned portions formed on an outer face of the lens, and the CCD image sensor imaging the lens and identifying the patterned portions, and then the SMT apparatus obtaining a location of the lens relative to the LED;
   positioning the lens on the PCB to cover the LED by the SMT apparatus; and
   fixing the lens on the PCB.

2. The method of claim 1, wherein a manner of positioning a corresponding lens on the PCB by the SMT apparatus comprises following steps: fixing the PCB with the LEDs mounted thereon in the SMT apparatus; carrying the corresponding lens by the nozzle of the SMT apparatus; the CCD image sensor imaging the lens and identifying the patterned portions to locate the lens relative to a corresponding LED on the PCB; the SMT apparatus calculating a location variation between the lens and the corresponding LED; and the nozzle of the SMT apparatus positioning the lens on the PCB to cover the corresponding LED, according to the location variation.

3. The method of claim 1, wherein each lens comprises a light-incident face facing the LED, a light-emitting face opposite to the light-incident face, and a lateral face interconnecting the light-incident face and the light-emitting face.

4. The method of claim 3, wherein each lens further comprises an annular flange protruding outwardly from the lateral face of the lens.

5. The method of claim 4, wherein the patterned portions are formed on the annular flange.

6. The method of claim 3, wherein the patterned portions are formed on the light-incident face.

7. The method of claim 3, wherein the patterned portions are formed on the light-emitting face.

8. The method of claim 3, wherein the patterned portions are formed on the lateral face.

9. The method of claim 1, wherein the patterned portions are evenly spaced from each other.

10. The method of claim 1, wherein a dimension of each patterned portion is 0.1 mm.

11. A method for manufacturing an LED module, comprising following steps:
    providing a SMT (Surface Mount Technology) apparatus having a first CCD (Charge-Coupled Device) image sensor, a second CCD image sensor, and a nozzle, and providing a PCB and fixing the PCB in the SMT apparatus;
    providing a plurality of LEDs and mounting the LEDs on the PCB by the SMT apparatus;
    providing a plurality of lenses each having a plurality of patterned portions formed on an outer face of the lens, and the first CCD image sensor imaging the lens, and then the SMT apparatus obtaining a location of each lens relative to a corresponding LED;
    positioning the lens on the PCB to cover the corresponding LED by the SMT apparatus;
    imaging the lens and identifying the patterned portions by the second CCD image sensor, and adjusting a position of the lens relative to the corresponding LED by the SMT apparatus; and
    fixing the lens on the PCB.

12. The method of claim 11, wherein a manner of positioning the lens on the PCB by the SMT apparatus comprises following steps: fixing the PCB with the LEDs mounted thereon in the SMT apparatus; carrying a corresponding lens by the nozzle of the SMT apparatus; the first CCD image sensor imaging the lens to locate the lens relative to a corresponding LED on the PCB; the SMT apparatus calculating a first location variation between the lens and the corresponding LED; the nozzle of the SMT apparatus positioning the lens on the PCB to cover the corresponding LED, according to the first location variation; the first CCD image sensor imaging the lens and identifying the patterned portions; the SMT apparatus calculating a second location variation between the lens and the corresponding LED; the nozzle of the SMT apparatus adjusting a portion of the lens on the PCB relative to the corresponding LED, according to the second location variation.

13. The method of claim 11, wherein each lens comprises a light-incident face facing the LED, a light-emitting face opposite to the light-incident face, and a lateral face interconnecting the light-incident face and the light-emitting face.

14. The method of claim 13, wherein each lens further comprises an annular flange protruding outwardly from the lateral face of the lens.

15. The method of claim 14, wherein the patterned portions are formed on the annular flange.

16. The method of claim 13, wherein the patterned portions are formed on the light-incident face.

17. The method of claim 13, wherein the patterned portions are formed on the light-emitting face.

18. The method of claim 13, wherein the patterned portions are formed on the lateral face.

19. The method of claim 11, wherein a resolution of the second CCD image sensor is higher than that of the first image sensor.

20. The method of claim 11, wherein a dimension of each patterned portion is 0.1 mm.

* * * * *